(12) United States Patent
Song

(10) Patent No.: US 11,921,396 B2
(45) Date of Patent: Mar. 5, 2024

(54) VIEWING ANGLE ADJUSTMENT DEVICE AND DISPLAY DEVICE INCLUDING THE SAME

(71) Applicant: LG Display Co., Ltd., Seoul (KR)

(72) Inventor: Youngki Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/961,906

(22) Filed: Oct. 7, 2022

(65) Prior Publication Data
US 2023/0205040 A1      Jun. 29, 2023

(30) Foreign Application Priority Data

Dec. 27, 2021   (KR) ......................... 10-2021-0188023

(51) Int. Cl.
| | | |
|---|---|---|
| *G02F 1/1685* | (2019.01) | |
| *G02F 1/13* | (2006.01) | |
| *G02F 1/1335* | (2006.01) | |
| *G02F 1/167* | (2019.01) | |
| *G02F 1/1675* | (2019.01) | |
| *G02F 1/1676* | (2019.01) | |
| *G02F 1/1677* | (2019.01) | |
| *H10K 59/50* | (2023.01) | |

(52) U.S. Cl.
CPC .......... *G02F 1/1685* (2019.01); *G02F 1/1323* (2013.01); *G02F 1/133553* (2013.01); *G02F 1/167* (2013.01); *G02F 1/1677* (2019.01); *H10K 59/50* (2023.02); *G02F 1/133504* (2013.01); *G02F 1/1676* (2019.01); *G02F 2001/1678* (2013.01); *G02F 2201/50* (2013.01)

(58) Field of Classification Search
CPC .......... G02F 1/1323; G02F 2001/1678; G02F 1/1685; G02F 1/167; G02F 1/1677; G02F 1/1676; G02F 1/165; H01L 27/3232; H01L 27/3225; H10K 59/50
See application file for complete search history.

(56) References Cited

U.S. PATENT DOCUMENTS

| | | | |
|---|---|---|---|
| 2018/0341130 A1* | 11/2018 | Kim ........................ | G02B 26/02 |
| 2020/0033689 A1* | 1/2020 | Lee ....................... | H10K 59/126 |
| 2020/0133062 A1* | 4/2020 | Lee ................... | G02F 1/133524 |

FOREIGN PATENT DOCUMENTS

| | | | | |
|---|---|---|---|---|
| KR | 10-2020-0046370 A | 5/2020 | | |
| KR | 10-2195661 B1 | 12/2020 | | |
| WO | WO-2021091275 A1 * | 5/2021 | ............. | G02F 1/167 |

* cited by examiner

*Primary Examiner* — Jia X Pan
(74) *Attorney, Agent, or Firm* — Birch, Stewart, Kolasch & Birch, LLP

(57) ABSTRACT

A viewing angle adjustment device and a display device including the same are discussed. The viewing angle adjustment device can include a first protective layer, a second protective layer disposed on the first protective layer, a light conversion layer disposed between the first protective layer and the second protective layer and including dispersion liquid having dispersed floating particles, and an auxiliary light conversion layer disposed on the second protective layer. The auxiliary light conversion layer can include first patterns where a light absorbing layer and a transparent layer are disposed in a center area, and second patterns where the light absorption layer, the transparent layer and a reflective layer are disposed in an edge area.

24 Claims, 14 Drawing Sheets

VIEWING ANGLE ADJUSTMENT DEVICE AND DISPLAY DEVICE INCLUDING THE SAME

CROSS REFERENCE TO RELATED APPLICATION

The present application claims priority to Korea Patent Application No. 10-2021-0188023, filed Dec. 27, 2021 in the Republic of Korea, the entire contents of which are incorporated by reference into the present application.

BACKGROUND

Field

The present disclosure relates to a viewing angle adjustment device and a display device including the same.

Discussion of the Related Art

Recently, as importance to protect privacy of a user increases, a display device equipped with a viewing angle adjustment device to protect privacy is supplied. Such a display device makes people around a user to not view contents displayed on the display device, by limiting a viewing angle of the display device through the viewing angle adjustment device.

With reference to FIG. 1, a display device 1 having a viewing angle adjustment device 20 includes a display panel 10 and a viewing angle adjustment device 20. The viewing angle adjustment device 20 is disposed on a surface of the display panel 10 and limits a viewing angle of an image being displayed in the display panel 10.

For example, the viewing angle adjustment device 20 includes a plurality of partition walls 21 composed of a light blocking material in its inside, and thus, opens a light path to a front of the display panel 10 and closes a light path to a side thereof. Therefore, only a user who uses the display device 1 at a front of the display panel 10 can view an image displayed in the display panel 10, and people around the user who keep an eye on the display device 1 find it hard to view the displayed image in the display panel 10.

If the display device is a large area device, a user positioned in front of the center of the display device in general can be positioned substantially on the side with respect to the edge of the display device. If the viewing angle adjustment device 20 is applied to the large area device, there can be limitations in that the viewing angle of a user to an edge area can be limited and the luminance at the edge area can deteriorate.

SUMMARY OF THE DISCLOSURE

The present disclosure provides a viewing angle adjustment device capable of opening a part of a viewing angle to an inner side surface in an edge area, by using an auxiliary light conversion layer where a light absorption layer, a transparent layer and a reflective layer are stacked in an edge area, and a display device including the same.

One embodiment is directed to providing a viewing angle adjustment device including a first protective layer; a second protective layer disposed on the first protective layer; a light conversion layer disposed between the first protective layer and the second protective layer and including dispersion liquid having dispersed floating particles; and an auxiliary light conversion layer disposed on the second protective layer.

The auxiliary light conversion layer can include first patterns where a light absorbing layer and a transparent layer are disposed in a center area, and second patterns where the light absorption layer, the transparent layer and the reflective layer are disposed in an edge area.

The second patterns can have a structure where the light absorption layer, the transparent layer and the reflective layer are stacked in order along one direction from an inside to an outside of the viewing angle adjustment device.

The edge area can be an area where a viewing angle of a user positioning in front of the viewing angle adjustment device is 30 degrees or more.

The reflective layer can refract a portion of light entering to the auxiliary light conversion layer after being emitted from the light conversion layer and emit refracted portion of light in an inward direction of the viewing angle adjustment device.

The viewing angle to the inward direction of the viewing angle adjustment device can be opened through the reflective layer for the edge area.

The light conversion layer can have a structure where a partition wall portion and a containing portion with the dispersion liquid injected are alternately disposed, and heights of the first patterns and the second patterns of the auxiliary light conversion layer can be $1/10$ or less of a height of the containing portion.

A density of the second patterns in the edge area can gradually increase towards an outside of the viewing angle adjustment device.

A density of the second patterns in the overall area of the auxiliary light conversion layer can have a Gaussian distribution.

The auxiliary light conversion layer can further include reflection patterns protruding from an inner side surface of the reflective layer and having a reverse taper-shaped inner side surface.

The auxiliary light conversion layer can further include light diffusion beads disposed on an inner side surface of the reflective layer.

The transparent layer can have a sectional form of a reverse prism which is an inverted triangle, the light absorption layer can be formed to cover an inner side surface of the transparent layer, and the reflective layer can be formed to cover the light absorption layer.

The transparent layer can be formed by coating a transparent layer surface with a white colored reflective material or a silver-colored highly reflective coating agent, or can be composed of an acrylic resin.

The reflective layer can have a higher refractive index than a refractive index of the light absorption layer and the transparent layer.

Another embodiment is directed to providing a display device including a display panel disposing pixels and displaying an image; a viewing angle adjustment device adjusting a viewing angle of the display panel by controlling a path of light emitted by the display panel according to a drive mode; and a cover substrate disposed on the viewing angle adjustment device.

The viewing angle adjustment device can include a first protective layer; a second protective layer disposed on the first protective layer; a light conversion layer disposed between the first protective layer and the second protective layer and including dispersion liquid having dispersed floating particles; and an auxiliary light conversion layer disposed on the second protective layer.

The auxiliary light conversion layer can include first patterns where a light absorbing layer and a transparent layer are disposed in a center area, and second patterns where the light absorption layer, the transparent layer and the reflective layer are disposed in an edge area.

The second patterns can have a structure where the light absorbing layer, the transparent layer and the reflective layers are stacked in order along one direction from an inside to an outside of the viewing angle adjustment device.

The light conversion layer can have a structure where a partition wall portion and a containing portion with the dispersion liquid injected are alternately disposed, and a height of the first patterns and the second patterns of the auxiliary light conversion layer can be 1/10 or less of a height of the containing portion.

A density of the second patterns in the edge area can gradually increase towards an outside of the viewing angle adjustment device.

The auxiliary light conversion layer can further include reflection patterns protruding from an inner side surface of the reflective layer and having a reverse taper-shaped inner side surface.

The auxiliary light conversion layer can further include light diffusion beads disposed on an inner side surface of the reflective layer.

The transparent layer can have a sectional form of a reverse prism which is an inverted triangle, the light absorption layer can be formed to cover an inner side surface of the transparent layer, and the reflective layer can be formed to cover the light absorption layer.

Another embodiment is directed to providing a viewing angle adjustment device including a first protective layer; a second protective layer disposed on the first protective layer; a first electrode disposed on a upper surface of the first protective layer; a second electrode disposed on a lower surface of the second protective layer; a light conversion layer disposed between the first electrode and the second electrode and comprising a partition wall portion and a containing portion alternately disposed, the containing portion including dispersion liquid and floating particles dispersed inside the dispersion liquid; and an auxiliary light conversion layer disposed on the second protective layer.

The auxiliary light conversion layer can include first patterns where a light absorbing layer and a transparent layer are disposed in a center area, and second patterns where the light absorption layer, the transparent layer and the reflective layer are disposed in an edge area.

The second patterns can have a structure where the light absorption layer, the transparent layer and the reflective layer are stacked in order along one direction from an inside to an outside of the viewing angle adjustment device.

Another embodiment is directed to providing a display device including a display panel disposing pixels and displaying an image; a viewing angle adjustment device adjusting a viewing angle of the display panel by controlling a path of light emitted by the display panel according to a drive mode; and a cover substrate disposed on the viewing angle adjustment device.

The viewing angle adjustment device can include a first protective layer; a second protective layer disposed on the first protective layer; a first electrode disposed on a upper surface of the first protective layer; a second electrode disposed on a lower surface of the second protective layer; a light conversion layer disposed between the first electrode and the second electrode and comprising a partition wall portion and a containing portion alternately disposed, the containing portion including dispersion liquid and floating particles dispersed inside the dispersion liquid; and an auxiliary light conversion layer disposed on the second protective layer.

The auxiliary light conversion layer can include first patterns where a light absorbing layer and a transparent layer are disposed in a center area, and second patterns where the light absorption layer, the transparent layer and the reflective layer are disposed in an edge area.

The second patterns can have a structure where the light absorption layer, the transparent layer and the reflective layer are stacked in order along one direction from an inside to an outside of the viewing angle adjustment device.

The viewing angle adjustment device and the display device including the same according to the embodiments protect privacy of a user of a large area display device and, at the same time, do not limit a viewing area of a user.

In addition, the viewing angle adjustment device and the display device including the same according to the embodiments can solve a problem of luminance deterioration at an edge area of a large area display device including a viewing angle adjustment device, and improve quality thereof.

DETAILED DESCRIPTION OF THE EMBODIMENTS

Figure 1:
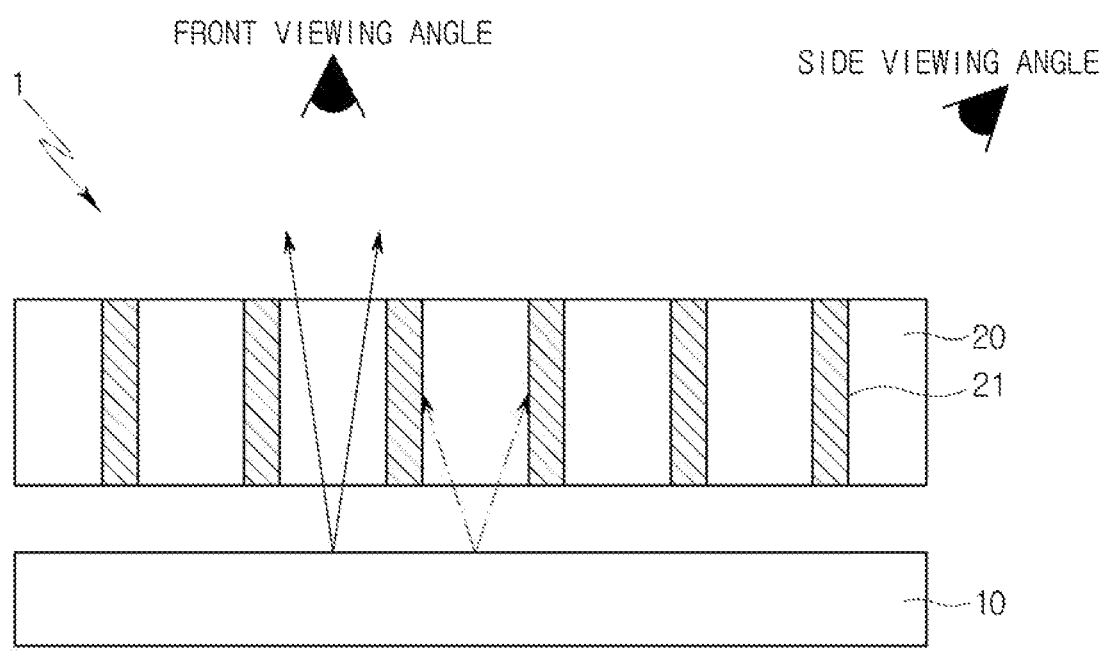
FIG. 1 is a schematic diagram of a display device including a viewing angle adjustment device.

Hereinafter, the embodiments will be described with reference to the accompanying drawings. When an element (or an area, a layer, a part and the like) is 'on' another element, is 'connected' with, or is 'coupled' to another element, the element can be directly connected with or coupled to another element or a third intervening element can be disposed therebetween.

Like reference numerals of the accompanying drawings denote like elements. In addition, thicknesses, proportions and dimensions of the elements in the accompanying drawings are exaggerated for convenience of describing the specification. The term "and/or" includes any and all combinations of one or more of the associated listed items.

Though terms such as 'a first', or 'a second' are used to describe various components, these components are not confined by these terms. These terms are merely used to distinguish one component from the other component. For example, without departing from the scope of the rights of various embodiments of the present invention, a first component can be referred to as a second component, and similarly, a second component can be referred to as a first component. The singular forms expressed herein are intended to include the plural forms as well, unless the context expressly indicates otherwise.

Terms such as 'below', 'at a lower portion', 'on', 'at an upper portion' and the like are used to describe position relation of parts illustrated in the accompanying drawings. Such terms are of relative concept, and are explained based on the directions marked in the drawings.

It should be understood that terms such as 'comprise', or 'have' and the like are used only to designate that there are features, numbers, steps, operations, components, parts or combination thereof, however such terms do not preclude existence or addition of one or more another features, numbers, steps, operations, components, parts or combination thereof.

Further, all the components of each viewing angle adjusting device and any apparatus including such device according to all embodiments of the present disclosure are operatively coupled and configured.

Figure 2:
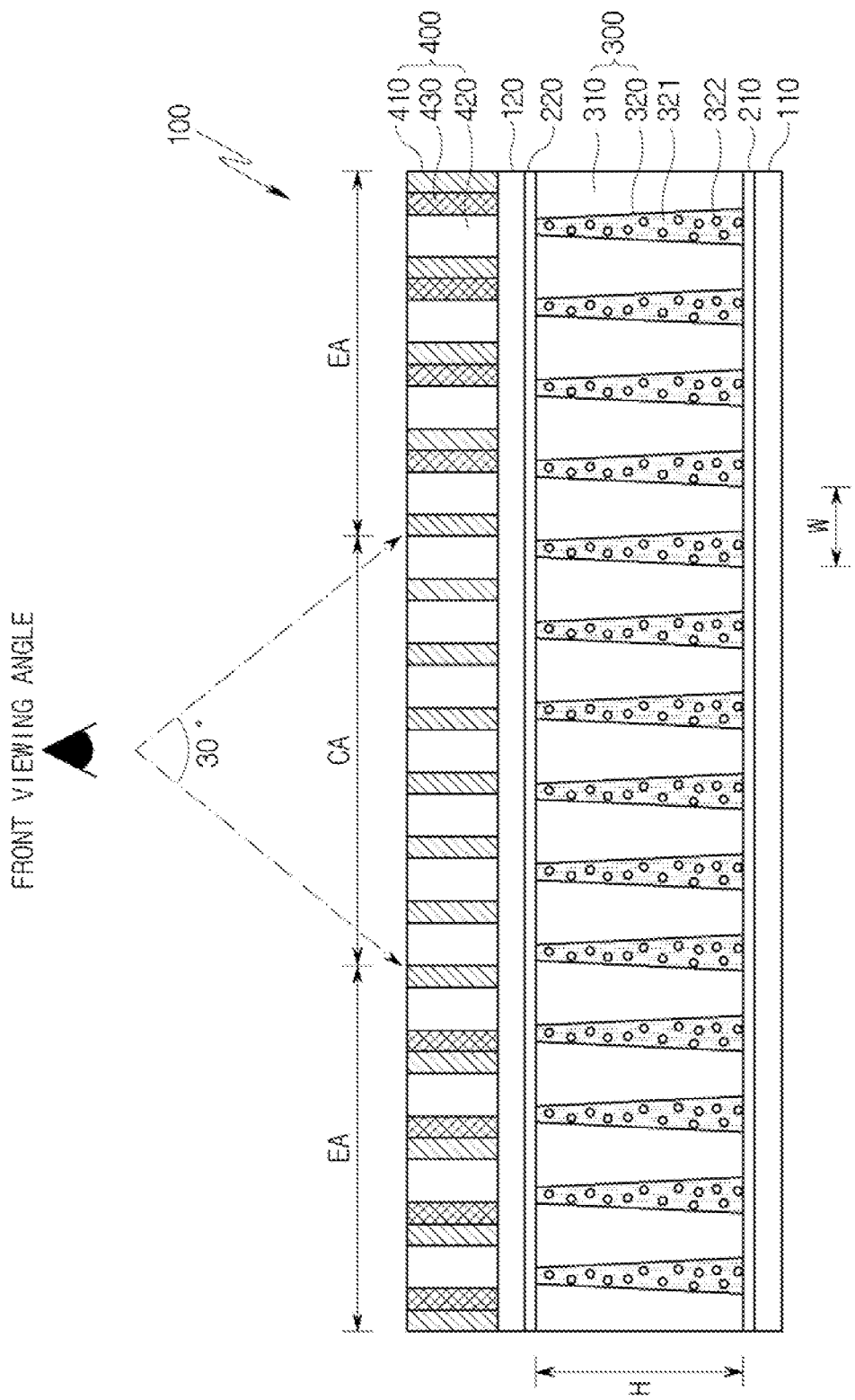
FIGS. 2 and 3 are schematic cross-sectional views of a viewing angle adjustment device according to a first embodiment of the present disclosure.
Figure 3:
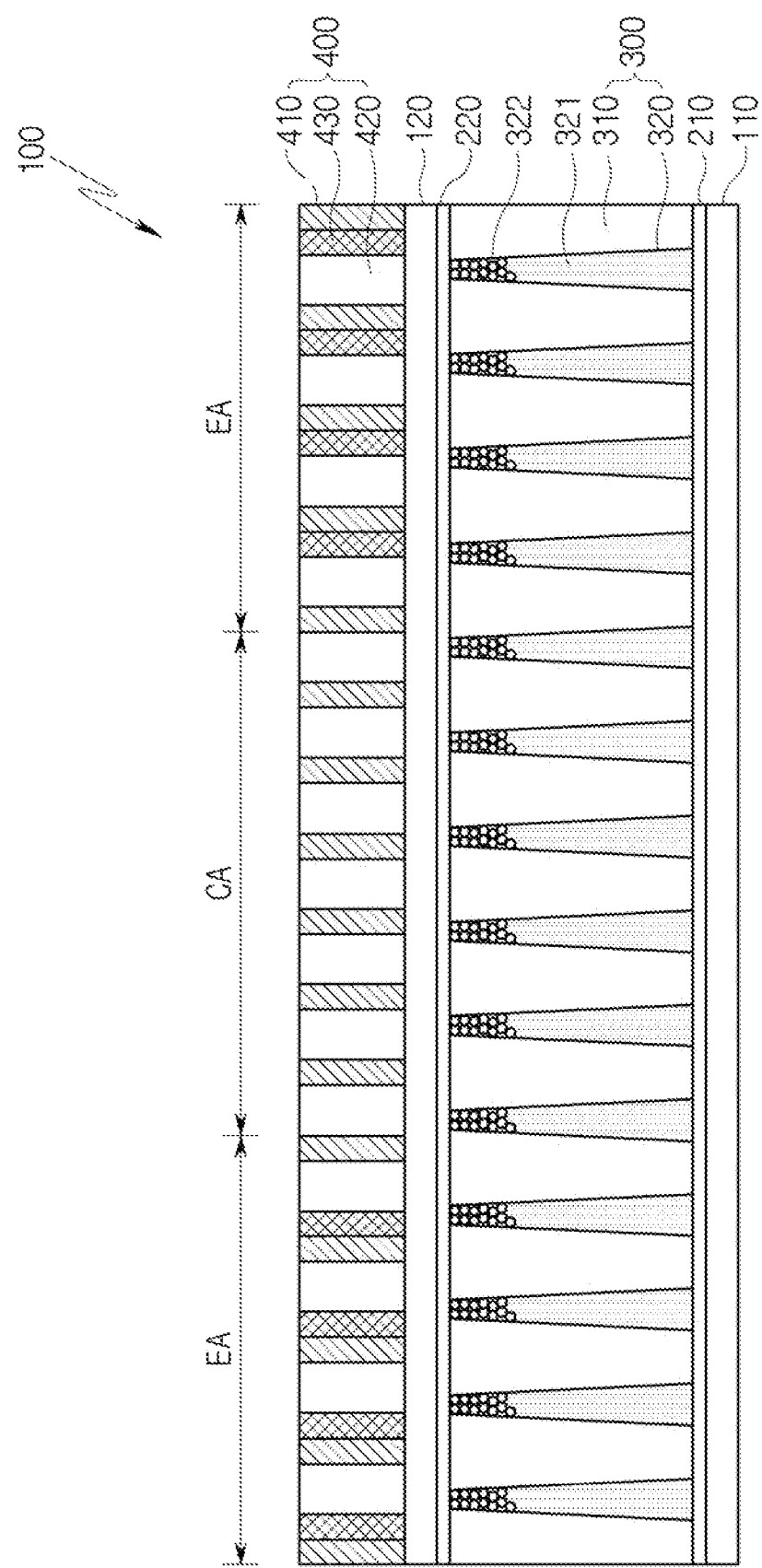

FIGS. 2 and 3 are schematic cross-sectional views of a viewing angle adjustment device according to a first embodiment of the present disclosure. FIG. 2 illustrates a light blocking mode of a viewing angle adjustment device 100, and FIG. 3 illustrates a light transmissive mode of a viewing angle adjustment device 100.

With reference to FIGS. 2 and 3, the viewing angle adjustment device 100 according to the first embodiment can include a first protective layer 110, a second protective layer 120, a first electrode 210, a second electrode 220, a light conversion layer 300 and an auxiliary light conversion layer 400.

The first protective layer 110 is a base substrate of the viewing angle adjustment device 100 and can be a light transmitting substrate. The first protective layer 110 can be a rigid substrate that includes glass or tempered glass, or a flexible substrate made of plastic. For example, the first protective layer 110 is a flexible polymer film, and can be formed of one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), Cyclic Olefin Copolymer (COC), triacetylcellulose (TAC) film, polyvinyl alcohol (PVA) film, polyimide (PI), and polystyrene (PS). However, a material of the first protective layer 110 is not limited thereto.

The first electrode 210 can be disposed on one surface (for example, top surface) of the first protective layer 110. The first electrode 210 is disposed between the first protective layer 110 and the second protective layer 120 that is to be explained later on. For example, the first electrode 210 can be disposed on a top surface of the first protective layer 110 by having a planar electrode shape. However, the present embodiment is not limited thereto, and the first electrode 210 can be disposed to have a pattern electrode form having a regular pattern on the first protective layer 110 in another embodiment.

The first electrode 210 can be formed of a transparent conductive material. For example, the first electrode 210 can be formed of indium tin oxide (ITO), indium zinc oxide (IZO), copper oxide, tin oxide, zinc oxide (ZnO), or titanium oxide and the like. In one embodiment, light transmissivity of the first electrode 210 can be about 80% or more. Then, the first electrode 210 is not recognized from the outside, and light transmissivity increases, luminance of the display device 1 can improve.

In another embodiment, the first electrode 210 can include various metals to implement low resistance. For example, the first electrode 210 can include at least one metal among chrome (Cr), nickel (Ni), copper (Cu), aluminum (Al), silver (Ag), molybdenum (Mo), gold (Au), titanium (Ti) and alloys thereof.

The second protective layer 120 can be disposed on the first protective layer 110. The second protective layer 120 is a light transmitting layer, and can be formed of the same or similar material as the material included in the first protective layer 110.

The second electrode 220 can be disposed on one surface of the second protective layer 120 (for example, below). The second electrode 220 is disposed between the first protective layer 110 and the second protective layer 120. For example, the second electrode 220 can be disposed below the second protective layer 120 by having a planar electrode shape. However, the present embodiment is not limited thereto, and in another embodiment, the second electrode 220 can be disposed to have a pattern electrode form having a regular pattern on the second protective layer 120.

The second electrode 220 can be formed of a transparent conductive material, and can include various metals to implement low resistance. The second electrode 220 can be formed of the same or similar material as the material included in the first electrode 210.

The light conversion layer 300 can be disposed between the first protective layer 110 and the second protective layer 120. The light conversion layer 300 can include a partition wall portion 310 and a containing portion 320. Specifically, the light conversion layer 300 can include a containing portion 320 divided into multiple areas by the partition wall portion 310.

In the light conversion layer 300, the partition wall portion 310 and the containing portion 320 can alternately disposed along one direction. In this instance, the partition wall portion 310 and the containing portion 320 can have the same or a different width towards the one direction. In the embodiment, a width (W) of a pattern formed of one partition wall portion 310 and one containing portion 320 adjacent thereto can be about 45 μm, but is not limited thereto.

The partition wall portion 310 can be formed of a transparent light transmitting material. For example, the partition wall portion 310 can be formed of an ultraviolet resin or a photoresist resin which are photocurable resins. Or, the partition wall portion 310 can be formed of at least one among a photocurable resin, urethane resin and an acrylic resin. The partition wall portion 310 can make light entered to the first protective layer 110 or second protective layer 120 pass through in the opposite direction.

The containing portion 320 can be formed to penetrate from a top to bottom portion of the partition wall portion 310. However, the present embodiment is not limited thereto, and the containing portion 320 can be formed by taking a shape of a containing groove that does not penetrate the partition wall portion 310. Depending on a height of the containing portion 320, a viewing angle of the viewing angle adjustment device 100 can change in a light blocking mode to be described later on. In the embodiment, a height (H) of the containing portion 320 can be about 100~140 μm, but is not limited thereto.

A width of one end and a width of another end of the containing portion 320 can be the same or different. A width of one end of the containing portion 320 that is adjacent to the first protective layer 110 can be wider than a width of another end thereof that is adjacent to the second protective layer 120. Depending on a width of the containing portion 320, transmissivity of the viewing angle adjustment device 100 can change in a light transmissive mode which will be described later on.

The containing portion 320 is disposed in a way, of which at least one area overlaps with the first electrode 210. The containing portion 320 can include dispersion liquid 321 and floating particles 322 dispersed inside the dispersion liquid 321. For example, in the containing portion 320, the dispersion liquid 321 is filled and the floating particles 322 can be dispersed inside the dispersion liquid 321.

The dispersion liquid 321 is a solvent in which floating particles 322 are dispersed, and can be a transparent insulating solvent having low viscosity. For example, the dispersion liquid 321 can include at least one among halocarbon oil, paraffinic oil and isopropyl alcohol.

The floating particles 322 can be colored electrophoretic particles, for example, can be black particles. The floating particles 322 can be carbon black particles, but is not limited thereto. The containing portion 320 can be electrically connected to the first electrode 210 and the second electrode 220, and arrangement of charged floating particles 322 can be controlled depending on a voltage difference between the first electrode 210 and the second electrode 220. Depending on the arrangement of the floating particles 322, the light conversion layer 300 can implement the light transmissive mode and the light blocking mode.

More specifically, if a voltage is not applied to the first electrode 210 and the second electrode 220, the floating particles 322 is uniformly dispersed inside the dispersion liquid 321 as illustrated in FIG. 2, thereby implementing the light blocking mode in which transmission of external light is blocked. In this case, external light applied to the partition wall portion 310 can transmit the light conversion layer 300, the external light can be recognized at a front of the viewing angle adjustment device 100. For example, the viewing angle adjustment device 100 can implement a private mode in which the viewing angle adjustment device 100 opens up a view to a certain viewing angle (for example, front viewing angle), and blocks a view to other viewing angle (for example, side viewing angle).

If a voltage is applied to at least one among the first electrode 210 and the second electrode 220, as illustrated in FIG. 3, the floating particles 322 can move in a direction of the first electrode 210 or the second electrode 220 by an electric field. At this time, a moving direction of the floating particles 322 can be controlled depending on a polarity of the floating particles 322 (negative or positive) and a relative magnitude of a voltage applied to the first electrode 210 and the second electrode 220.

If the floating particles 322 aggregate around the first electrode 210 or the second electrode 220, the light transmissive mode can be implemented as external light passes through the partition wall portion 310 and the containing portion 320. In other words, the viewing angle adjustment device 100 can implement a share mode that opens up a view both to a front and a side.

The viewing angle adjustment device 100 can be applied to a large area display device. When a large area display device operates in the share mode, the viewing angle adjustment device 100 is implemented in the light transmissive mode, opening up a viewing angle to a user who usually positions at a front center of the display device and people around a user positioning on a side of the display device. When the large area display device operates in the private mode, the viewing angle adjustment device 100 is implemented in the light blocking mode in which a viewing angle is opened up to a user and is blocked to people around a user.

At this time, if the large area display device is located near to the user, a viewing angle of a user can be limited at edges of the large area display device, and luminance of the edge area can deteriorate. In order to solve the problem, the viewing angle adjustment device 100 further includes an auxiliary light conversion layer 400 that opens up a part of the viewing angle so that light incident from the edge area can be emitted to a side thereof.

Hereinafter, a detailed structure of the auxiliary light conversion layer 400 will be explained.

Figure 4:
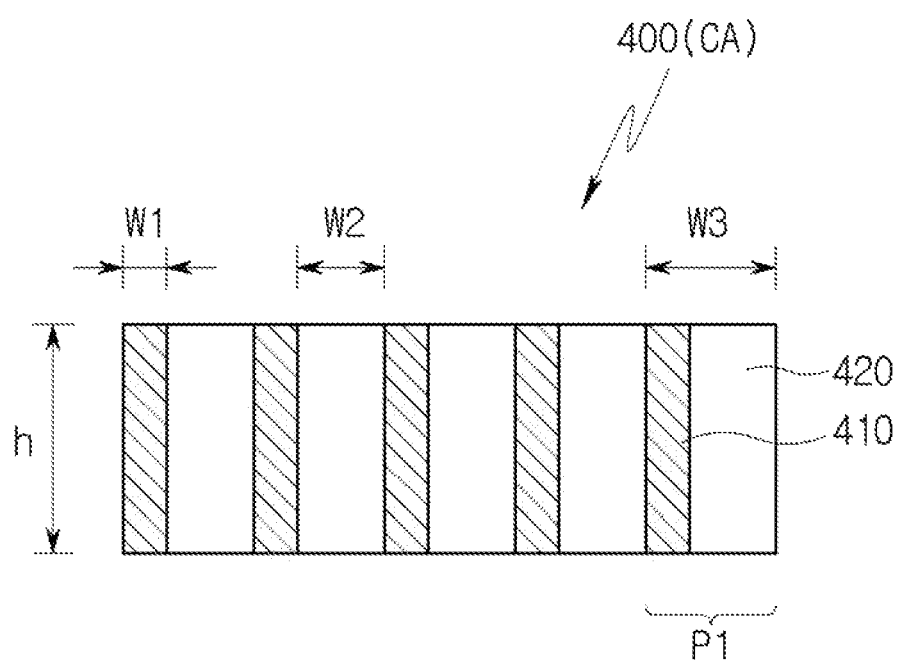
FIG. 4 is an enlarged cross-sectional view of a center area of an auxiliary light conversion layer according to the first embodiment of the present disclosure.
Figure 5:
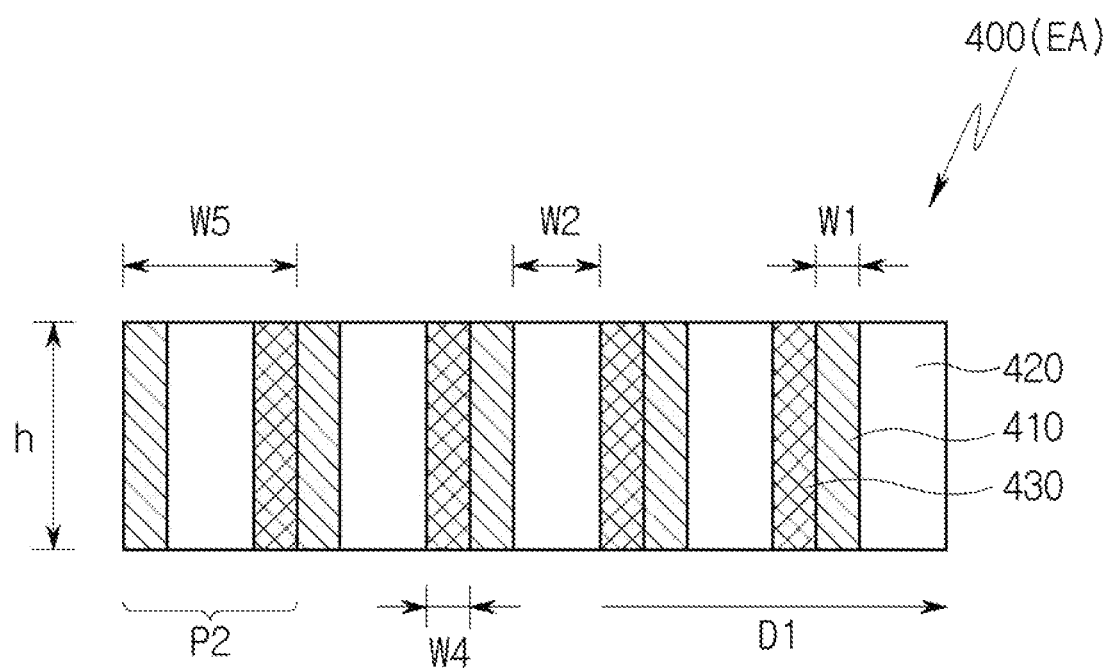
FIG. 5 is an enlarged cross-sectional view of an edge area on a side of an auxiliary light conversion layer according to the first embodiment of the present disclosure.
Figure 6:
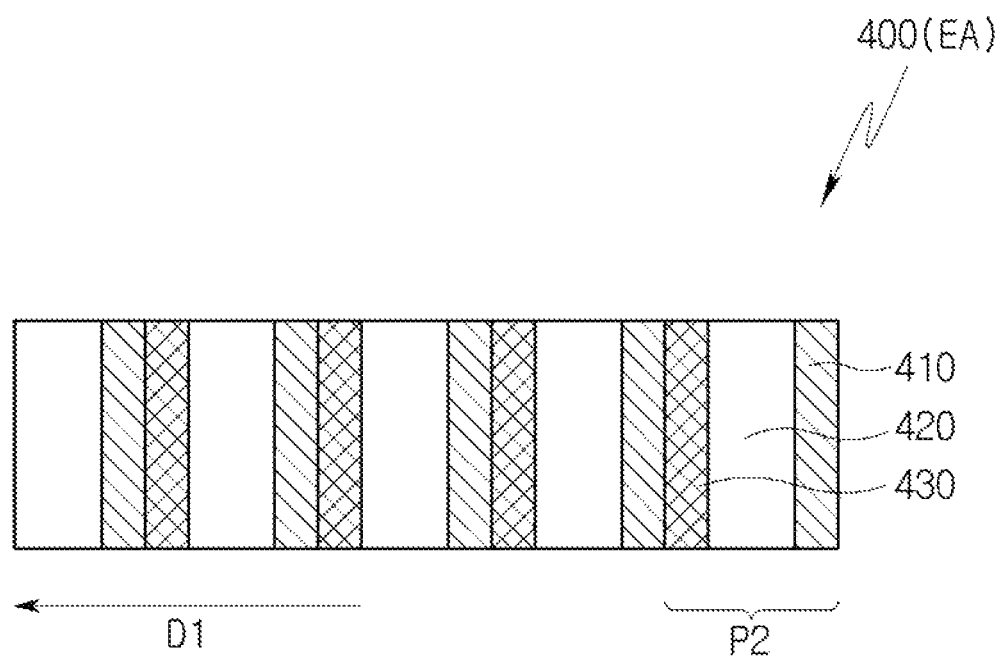
FIG. 6 is an enlarged cross-sectional view of an edge area on another side of an auxiliary light conversion layer according to the first embodiment of the present disclosure.

FIG. 4 is an enlarged cross-sectional view of a center area of an auxiliary light conversion layer according to the first embodiment. FIG. 5 is an enlarged cross-sectional view of an edge area on a side of an auxiliary light conversion layer according to the first embodiment. FIG. 6 is an enlarged cross-sectional view of an edge area on another side of an auxiliary light conversion layer according to the first embodiment.

With reference to FIGS. 2 to 6, the viewing angle adjustment device 100 according to the first embodiment includes the auxiliary light conversion layer 400. The auxiliary light conversion layer 400 can be disposed on another surface of the second protective layer 120 (for example, top surface).

In the center area (CA), the auxiliary light conversion layer 400 includes first patterns (P1) formed of the light absorbing layer 410 and a transparent layer 420 disposed adjacent to each other as illustrated in FIG. 4. The light absorbing layer 410 and the transparent layer 420 each can have the same or a different width. A width (W1) of the light absorbing layer 410 can be shorter than a width (W2) of the transparent layer 420. For example, a width (W1) of the light absorbing layer 410 can be about 1~3 μm, and a width (W2) of the transparent layer 420 can be about 30~40 μm. In the embodiment, when a width (W1) of the light absorbing layer 410 is 3 μm, and a width (W2) of the transparent layer 420 is 40 μm, a width (W3) of the first patterns (P1) can be about 43 μm. However, the embodiment is not limited thereto.

In the embodiment, a height (h) of the first patterns (P1) can be shorter than a height (H) of the containing portion 320 of the light conversion layer 300. More specifically, a height (h) of the first patterns (P1) can be about 1/10 or less of a height (H) of the containing portion 320 of the light conversion layer 300. For example, when a height (H) of the containing portion 320 is 104 μm, a height (h) of the first patterns (P1) can be about 10 μm, but is not limited thereto.

The light absorbing layer 410 can be formed to penetrate the auxiliary light conversion layer 400, or can be formed to take a shape of a containing groove without penetration. The light absorbing layer 410 can be formed of a colored light absorbing material. The light absorbing layer 410, for example, can be formed of an electronic ink including black particles, but is not limited thereto. The light absorbing layer 410 can block light incident from the light conversion layer 300 from passing through the opposite direction.

The transparent layer 420 can be formed of a transparent light transmission material. For example, the transparent layer 420 can be a photocurable resin, and can be formed of an ultraviolet resin or a photoresist resin. Or, the transparent layer 420 can be formed of at least one among a urethane resin and an acrylic resin. The transparent layer 420 can make light incident from the light conversion layer 300 pass through in the opposite direction.

In the edge area (EA), the auxiliary light conversion layer 400 includes second patterns (P2) where the light absorbing layer 410, the transparent layer 420 and the reflective layer 430 are disposed adjacent to each other (3-layer structure) as in FIGS. 5 and 6. In the second patterns (P2), the light absorbing layer 410, the transparent layer 420 and the reflective layer 430 are disposed in order along one direction (D1) from an inside to an outside of the auxiliary light conversion layer 400. Therefore, in an edge area (EA) of one side of the auxiliary light conversion layer 400, the second patterns (P2) have a structure where the light absorbing layer 410, the transparent layer 420 and the reflective layer 430 are disposed along the one direction (D1) as illustrated in FIG. 5, and in an edge area (EA) of another end of the auxiliary light conversion layer 400, the second patterns (P2) have a structure where the light absorbing layer 410, the transparent layer 420 and the reflective layer 430 are disposed along the one direction (D1) as illustrated in FIG. 6.

The light absorbing layer 410, the transparent layer 420 and the reflective layer 430 can have the same or a different width. A width (W1) of the light absorbing layer 410 and a width (W4) of the reflective layer 430 can be shorter than a width (W2) of the transparent layer 420. For example, a width (W1) of the light absorbing layer 410 is about 1~3 μm, a width (W2) of the transparent layer 420 is about 30~40 μm and a width (W4) of the reflective layer 430 can be 1~3 μm. In the embodiment, when a width (W1) of the light absorbing layer 410 is 3 μm and a width (W2) of the transparent layer 420 is 40 μm and a width (W4) of the reflective layer 430 is 3 μm, a width (W5) of patterns formed of one light absorbing layer 410, one transparent layer 420 adjacent thereto and one reflective layer 430 adjacent thereto can be about 46 μm. However, the present embodiment is not limited thereto.

In the embodiment, a height (h) of the second patterns (P2) is substantially the same as a height (h) of the first patterns (P1).

The reflective layer 430 can be formed of a material capable of reflecting and/or refracting light incident from the light conversion layer 300. In the embodiment, the reflective layer 430 can be a white colored reflective material applied on a transparent surface of a layer so that light that enters can be reflected and/or refracted on the surface. For example, the reflective layer 430 can be formed by coating the surface with titanium dioxide (TiO2) or with a silver-colored highly reflective coating agent.

Or, the reflective layer 430 can be formed of an acrylic resin so that light incident from a boundary area between the reflective layer 430 and the light absorbing layer 410 can be reflected and/or refracted. The acrylic resin is a polymer of acetone, cyanic acid and methyl methylacrylate and can have a refractive index according to polymerization conditions. Therefore, when forming each of the reflective layer 430 and the light absorbing layer 410 with acrylic resins made under different polymerization conditions, light in the boundary area between the reflective layer 430 and the light absorbing layer 410 can be refracted at a desired angle. In such embodiments, a refractive index of the reflective layer 430 can be higher than that of the light absorbing layer 410 and the transparent layer 420. For example, a refractive index of the reflective layer 430 can be about 1.6 and a refractive index of the light absorbing layer 410 and the transparent layer 420 can be about 1.49, but is not limited thereto.

A starting point of the edge area (EA) on which the second patterns (P2) are disposed can be determined based on a size of the viewing angle adjustment device 100 and a general (or expected) distance between the viewing angle adjustment device 100 and a user. For example, the starting point of the second pattern (P2) can be a point having a viewing angle of a user gazing at a front center of the viewing angle adjustment device 100 of about 30 degrees.

Figure 7:
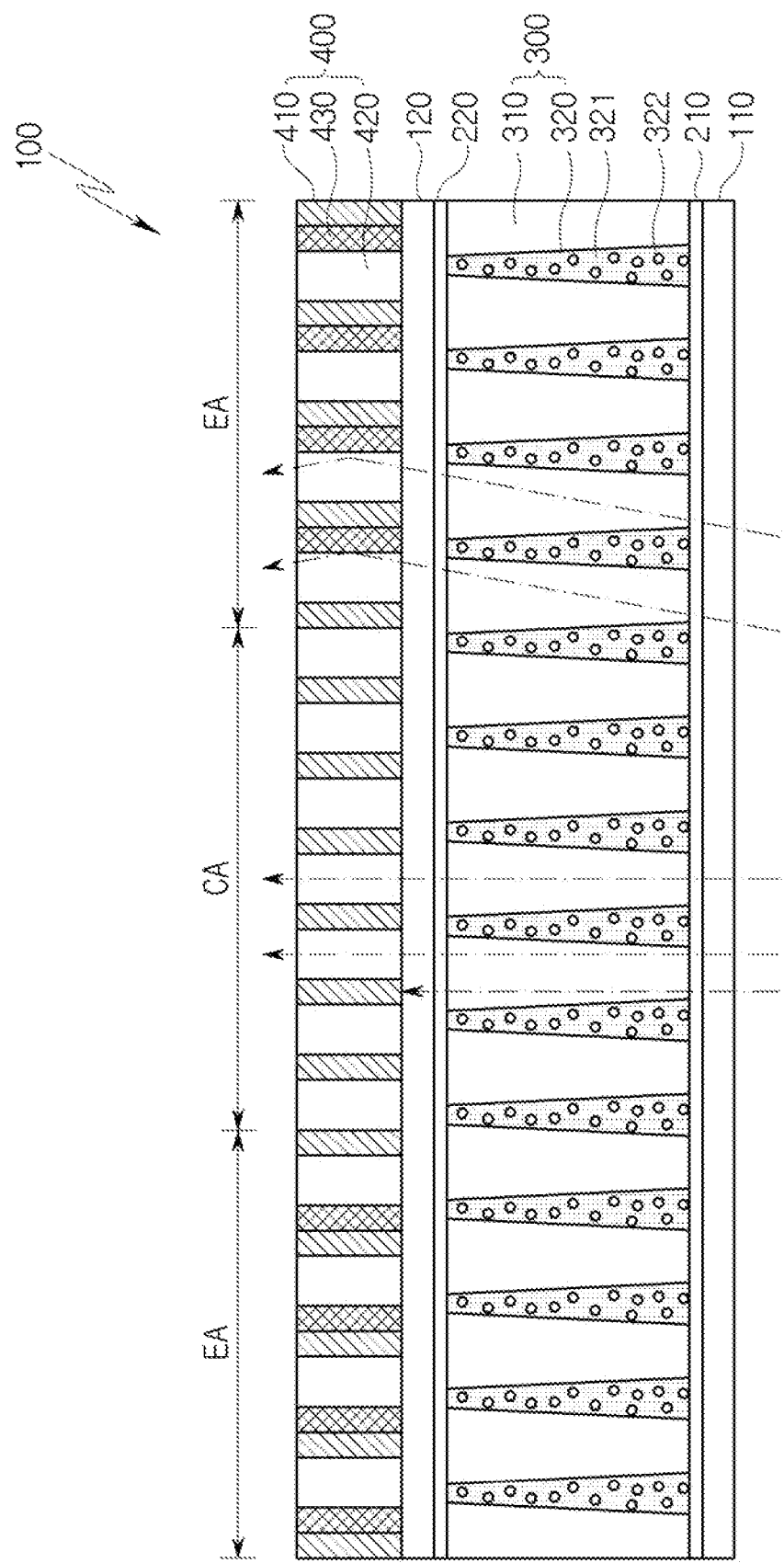
FIG. 7 is a drawing to describe a light traveling path of a viewing angle adjustment device according to the first embodiment of the present disclosure.
Figure 8:
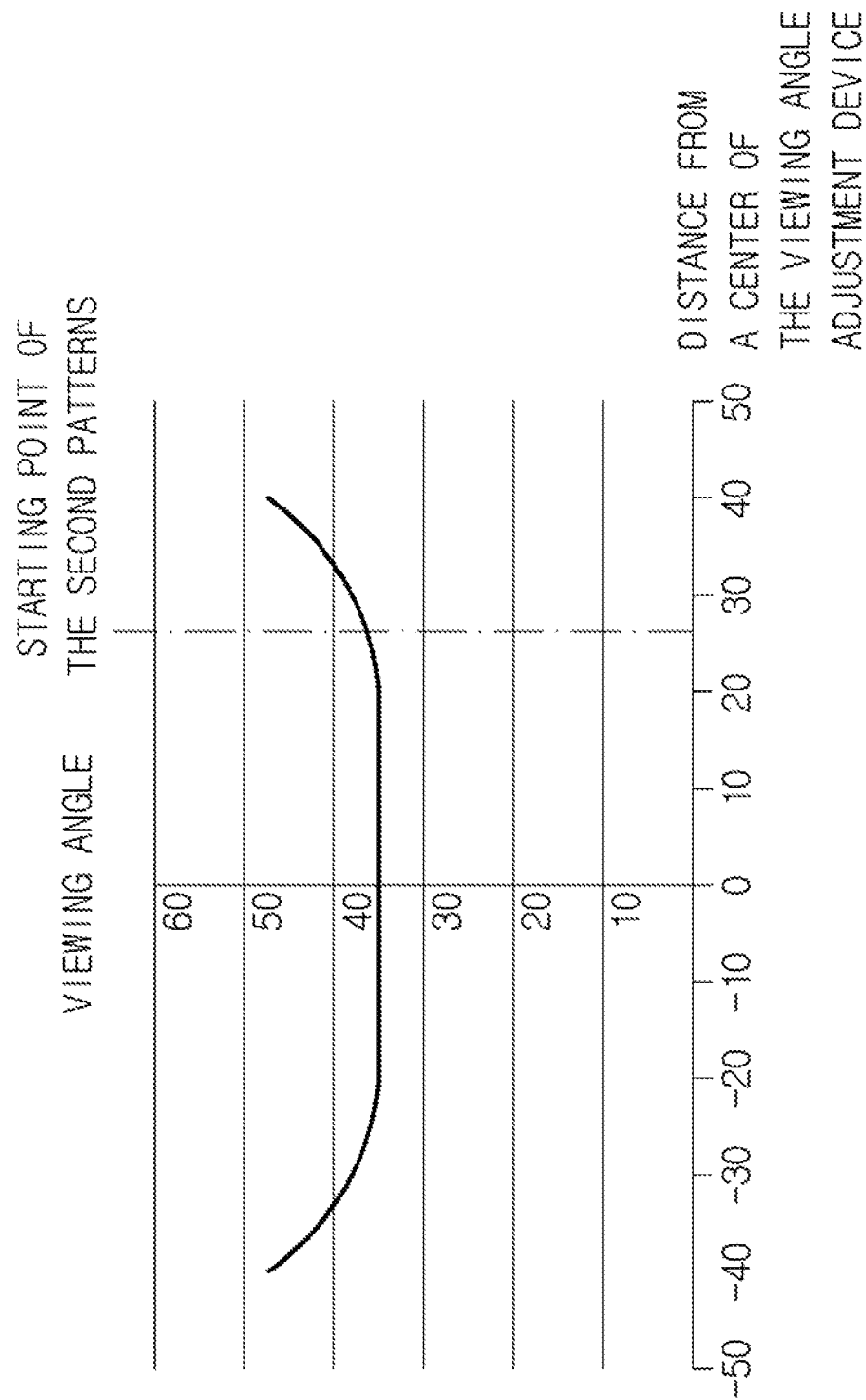
FIG. 8 is a graph showing a viewing angle per position of a viewing angle adjustment device according to the first embodiment of the present disclosure.

FIG. 7 is a drawing to describe a light traveling path of a viewing angle adjustment device according to the first embodiment. FIG. 8 is a graph showing a viewing angle per position of a viewing angle adjustment device according to the first embodiment.

With reference to FIG. 7, light emitted from the light conversion layer 300 can enter to the auxiliary light conversion layer 400. A portion of the light emitted perpendicular from the light conversion layer 300 is blocked by the light absorbing layer 410 and another portion thereof is passed through by the transparent layer 420 and/or the reflective layer 430, thereby a front viewing angle is opened.

Light emitted diagonally from the light conversion layer 300 and entering to a center area (CA) of the auxiliary light conversion layer 400 is generally blocked by the light absorbing layer 410, thereby a side viewing angle is blocked. At least a portion of light emitted diagonally from the light conversion layer 300 and entering to an edge area (EA) of the auxiliary light conversion layer 400 is reflected and/or refracted on a surface of the reflective layer 430 and/or on a boundary area between the reflective layer 430 and the light absorbing layer 410 and is emitted to one side. At this time, one side is an inner side surface of the viewing angle adjustment device 100, specifically, can be a front center direction.

As a result, by the auxiliary light conversion layer 400, in the edge area (EA) of the viewing angle adjustment device 100, a viewing angle can be opened not only to a front but also to one side. Here, one side to which a viewing angle is opened by the auxiliary light conversion layer 400 can be an inward direction, a front center direction of the viewing angle adjustment device 100. As such, regarding the auxiliary light conversion layer 400 according to the embodiment, a viewing angle opening in an edge area (EA) is wider than a viewing angle opening in a center area (CA).

With reference to FIG. 8, a viewing angle in a center area (CA) of the viewing angle adjustment device 100 according to the first embodiment is limited to 35 degrees. On the other hand, the edge area (EA) allows a substantially wider viewing angle than 35 degrees, since a portion of a viewing angle to the inner side surface is opened. In the embodiment illustrated in FIG. 8, a viewing angle in an edge area (EA) is limited to 35 degrees to 50 degrees.

Figure 9:
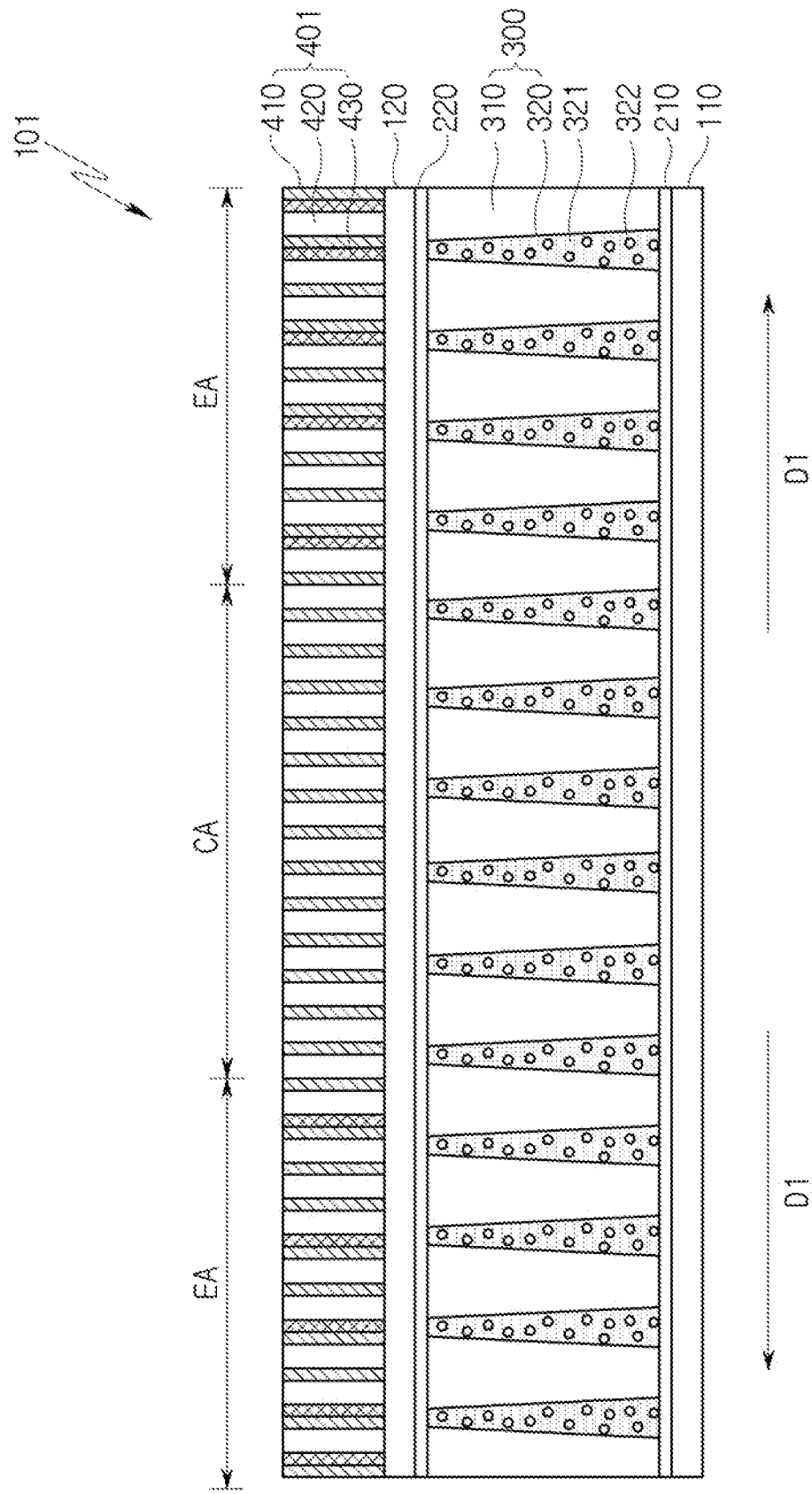
FIG. 9 is a schematic cross-sectional view of a viewing angle adjustment device according to a second embodiment of the present disclosure.
Figure 10:
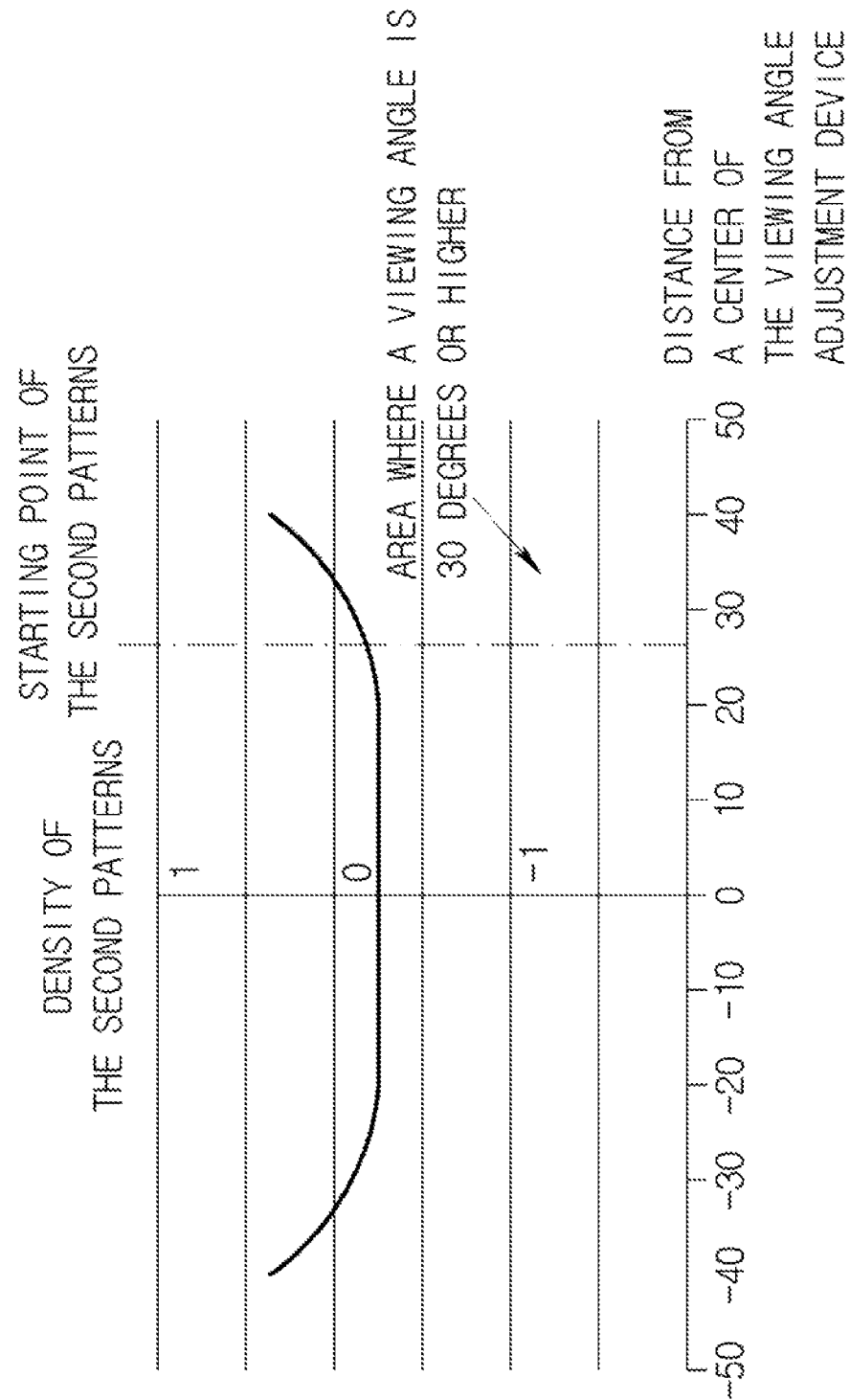
FIG. 10 is a graph showing distribution of second patterns of an auxiliary light conversion layer according to the second embodiment of the present disclosure.

FIG. 9 is a schematic cross-sectional view of a viewing angle adjustment device according to a second embodiment of the present disclosure. FIG. 10 is a graph showing distribution of second patterns of an auxiliary light conversion layer according to the second embodiment.

The viewing angle adjustment device 101 according to the second embodiment is substantially the same as the viewing angle adjustment device 100 of the first embodiment, except a structure of the auxiliary light conversion layer 401. Therefore, detailed description on the remaining components except the auxiliary light conversion layer 401 will be omitted hereinafter.

Referring to FIG. 9, the viewing angle adjustment device 101 according to the second embodiment can include the first protective layer 110, the second protective layer 120, the first electrode 210, the second electrode 220, the light conversion layer 300 and the auxiliary light conversion layer 401.

The auxiliary light conversion layer 401 includes first patterns (P1) where the light absorbing layer 410 and the transparent layer 420 are disposed adjacent to each other.

The light absorbing layer 410 can be formed to take a shape of a containing groove that either penetrates or doesn't penetrate the auxiliary light conversion layer 401. The light absorbing layer 410 can be a colored light absorbing material. The light absorbing layer 410, for example, can be formed of an electronic ink including black particles, but is not limited thereto. The light absorbing layer 410 can block light entered from the light conversion layer 300 from passing through in the opposite direction.

The transparent layer 420 can be formed of a transparent light transmission material. For example, the transparent layer 420 can be a photocurable resin, and can be formed of an ultraviolet resin or a photoresist resin. Or, the transparent layer 420 can be formed of at least one among a urethane resin and an acrylic resin. The transparent layer 420 can make light entered from the light conversion layer 300 pass through in the opposite direction.

In the edge area (EA), the auxiliary light conversion layer 401 includes second patterns (P2) where the light absorbing layer 410, the transparent layer 420 and the reflective layer 430 are disposed adjacent to each other (3-layer structure). In the second patterns (P2), the light absorbing layer 410, the transparent layer 420 and the reflective layer 430 are disposed in order along one direction (D1) from an inside to an outside of the auxiliary light conversion layer 401. Therefore, in an edge area (EA) of one side of the auxiliary light conversion layer 401, the second patterns (P2) have a structure where the light absorbing layer 410, the transparent layer 420 and the reflective layer 430 are disposed, and in an edge area (EA) of another end of the auxiliary light conversion layer 401, the second patterns (P2) have a structure where the light absorbing layer 410, the transparent layer 420 and the reflective layer 430 are disposed.

A density of the second patterns in the edge area (EA) can gradually increase towards an outside of the viewing angle adjustment device 101. In other words, in the edge area (EA), the number of repeating second patterns (P2) can gradually increase towards the outside of the viewing angle adjustment device 101.

For example, on one side contacting the center area (CA), the first patterns (P1) and the second patterns (P2) can be disposed. At this time, as it gets closer to the center area (CA) in the edge area (EA), the first patterns (P1) are more frequently disposed, and as it gets farther from the center area (CA), in other words, at an end of the viewing angle adjustment device 101, only the second patterns (P2) are more frequently disposed. For example, on one side contacting the center area (CA), per n (a random natural number) first pattern (P1), the second pattern (P2) is disposed, and a spacing with which the second pattern (P2) is disposed decreases, and at an end of the viewing angle adjustment device 101, only the second pattern (P2) can be continuously disposed. In FIG. 9, an example of setting n to 2 is illustrated, however the present embodiment is not limited thereto. A density of the second patterns (P2) in the overall area of the auxiliary light conversion layer 401 can have a Gaussian distribution as illustrated in FIG. 10.

According to the second embodiment, luminance between the center area (CA) and the edge area (EA) of the viewing angle adjustment device 101 is gradually improved, therefore, a user can view an image at an improved luminance in the entire area of the viewing angle adjustment device 101, without any recognition on boundary lines or a sense of difference by a user.

Figure 11:
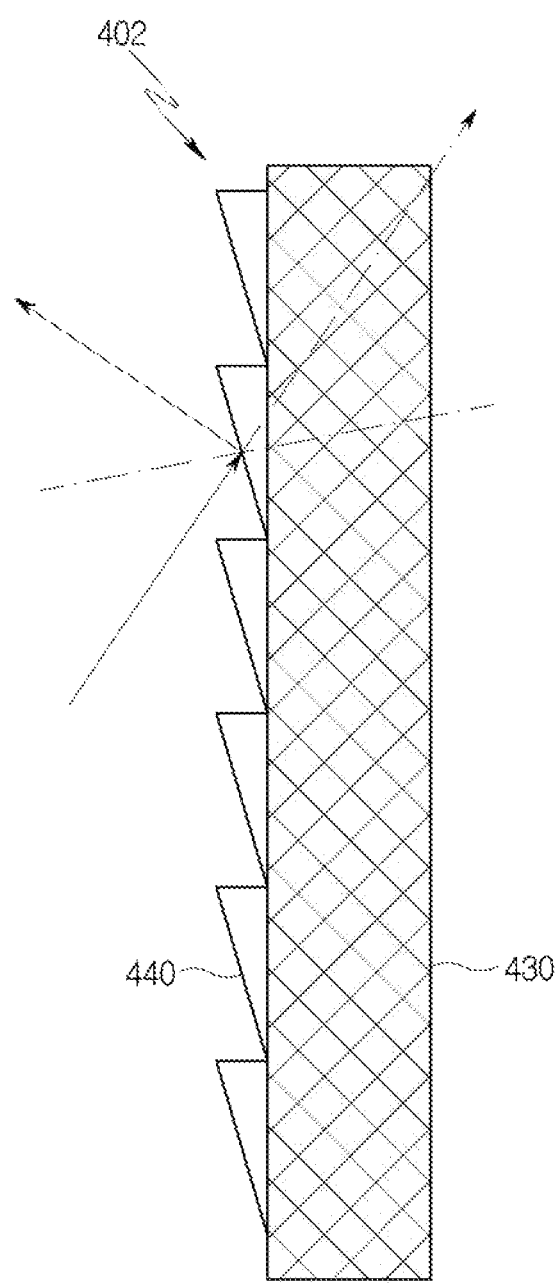
FIG. 11 is a cross-sectional view of a reflective layer according to an embodiment of the present disclosure.

FIG. 11 is a cross-sectional view of a reflective layer according to an embodiment of the present disclosure.

With reference to FIGS. 2, 3 and 11, the auxiliary light conversion layer 402 according to the embodiment can further include reflection patterns 440. The reflection patterns 440 have a reverse taper-shape protruded from a surface of the reflective layer 430. For example, the reflection patterns 440 can be formed on an inner side surface (for example, a surface adjacent to the center area (CA)) of the reflective layer 430. Such reflection patterns 440 can be formed of the same or similar material as a material forming the reflective layer 430.

A plurality of the reflection patterns 440 can be formed on one reflective layer 430. The plurality of the reflection patterns 440 can be disposed regularly or irregularly on a surface of the reflective layer 430.

The reflection patterns 440 can be formed in a way an inner side surface thereof has a reverse taper shape. For example, the reflection patterns 440 can be formed in a way a width of an end thereof through which light enters from the light conversion layer 300 can be formed narrower than that of another end through which the light is emitted.

Since a side surface of the reflection pattern 440 is a reverse taper-shaped, light that is incident diagonally from a lower part of the auxiliary light conversion layer 402 is reflected by the reflection pattern 440 and can be further concentrated at a front center of the viewing angle adjustment device 100. Accordingly, while the viewing angle adjustment device 100 limitingly opens up a viewing angle to the inner side surface in the edge area (EA) through the auxiliary light conversion layer 402, it ensures privacy of a user not to be infringed, by blocking a viewing angle to other side surfaces.

Figure 12:
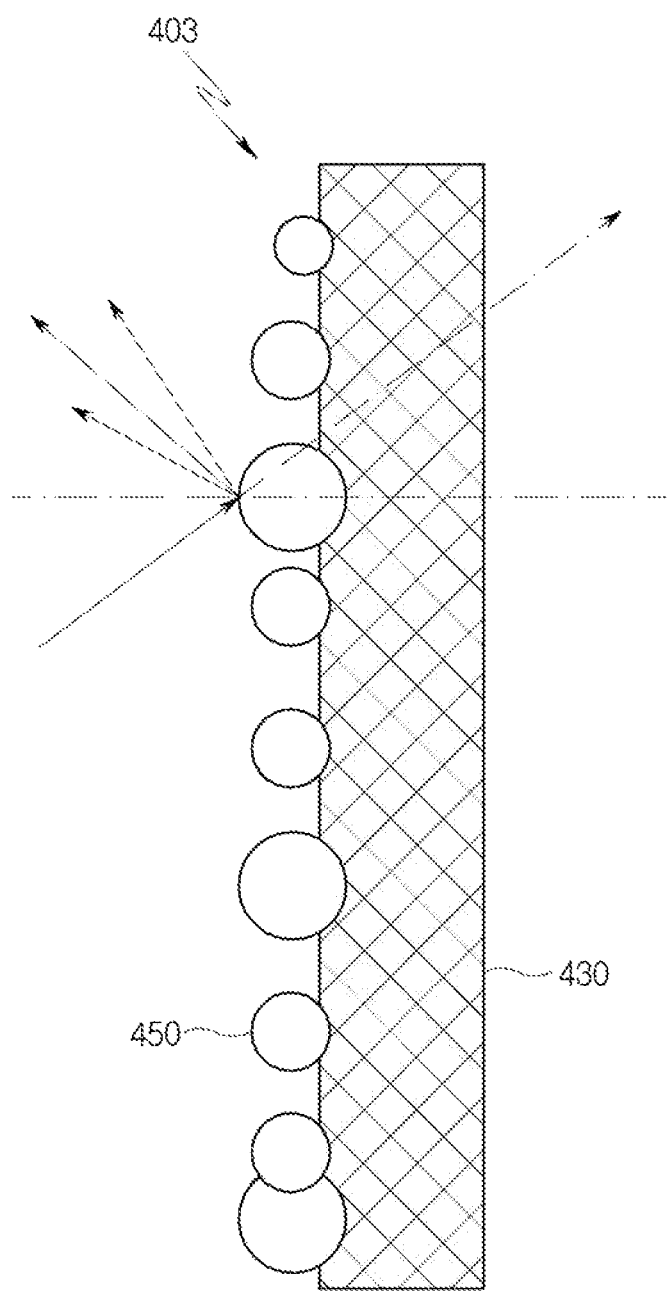
FIG. 12 is a cross-sectional view of a reflective layer according to another embodiment of the present disclosure.

FIG. 12 is a cross-sectional view of a reflective layer according to another embodiment of the present disclosure.

With reference to FIGS. 2, 3 and 12, the auxiliary light conversion layer 403 according to the embodiment can further includes light diffusion beads 450. The light diffusion beads 450 can be disposed on one surface of the reflective layer 430. For example, the light diffusion beads 450 can be formed on an inner surface of the reflective layer 430 (in other words, a surface adjacent to the center area (CA)).

When it comes to the light diffusion beads 450, a plurality of the light diffusion beads 450 can be formed on one reflective layer 430. A plurality of the light diffusion beads 450 can be disposed on one surface of the reflective layer 430 regularly, or irregularly.

The light diffusion beads 450 can be, for example, silicon beads or PMMA having a spherical shape, but is not limited thereto.

Light that enters diagonally to a lower part of the auxiliary light conversion layer 403 is diffused by light diffusion beads 450 and can be further concentrated at a front center of the viewing angle adjustment device 100. Consequently, the viewing angle adjustment device 100 can efficiently open up a viewing angle to the inner side surface in the edge area (EA) and improve luminance in the edge area (EA), through the auxiliary light conversion layer 403.

Figure 13:
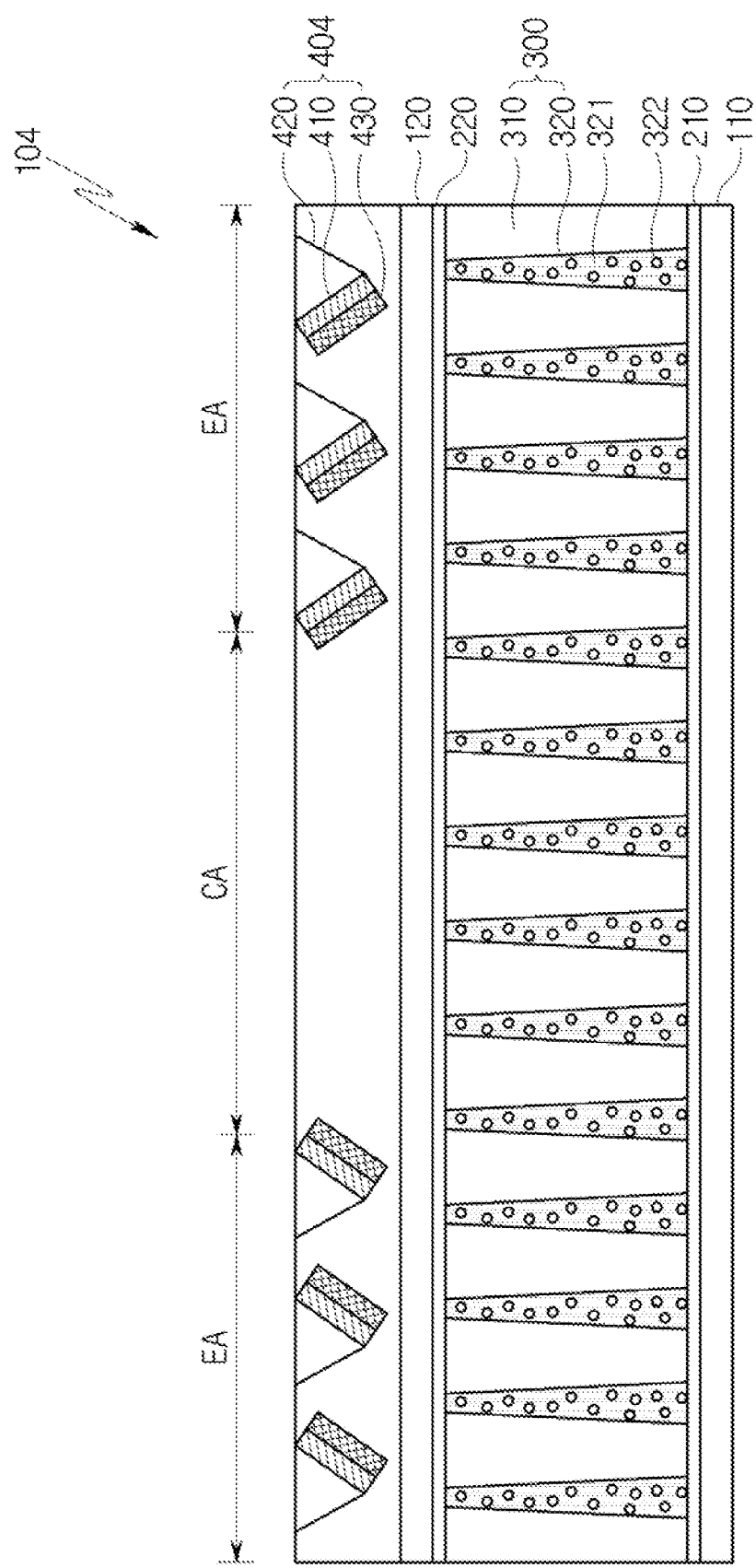
FIG. 13 is a schematic cross-sectional view of a viewing angle adjustment device according to a third embodiment of the present disclosure.

FIG. 13 is a schematic cross-sectional view of a viewing angle adjustment device according to a third embodiment of the present disclosure. The viewing angle adjustment device 104 according to the third embodiment is substantially the same as the viewing angle adjustment device 100 of the first embodiment, except a structure of the auxiliary light conversion layer 404. Therefore, detailed description on the remaining components except the auxiliary light conversion layer 404 will be omitted or may be briefly discussed.

With reference to FIG. 13, in the edge area (EA), the auxiliary light conversion layer 404 includes second patterns (P2) where the light absorbing layer 410, the transparent layer 420 and the reflective layer 430 are disposed adjacent to each other. The transparent layer 420 can be formed to have a sectional form of a reverse prism which is an inverted triangle as illustrated. The light absorbing layer 410 can be formed on a side surface of the transparent layer 420 having a reverse prism shape. For example, the light absorbing layer 410 can be formed to cover an inner side surface adjacent to a center area (CA) of the viewing angle adjustment device 104 among side surfaces of the transparent layer 420. The reflective layer 430 can be formed on the light absorbing layer 410. For example, the reflective layer 430 can be formed to cover the light absorbing layer 410.

When the auxiliary light conversion layer 404 includes reverse prism patterns, light enters diagonally to the lower part of the auxiliary light conversion layer 404 can be further concentrated at a front center of the viewing angle adjustment device 104. Accordingly, while the viewing angle adjustment device 104 limitingly opens up a viewing angle to the inner side surface in the edge area (EA) through the auxiliary light conversion layer 404, it prevents privacy of a user from infringement, by blocking a viewing angle to other side surfaces.

Meanwhile, in the embodiment, the auxiliary light conversion layer 404 may not include any pattern in a center area (CA). However, this embodiment is not limited thereto, and in the center area (CA), the first patterns (P1) according to the previous embodiments described can be provided thereto.

Figure 14:
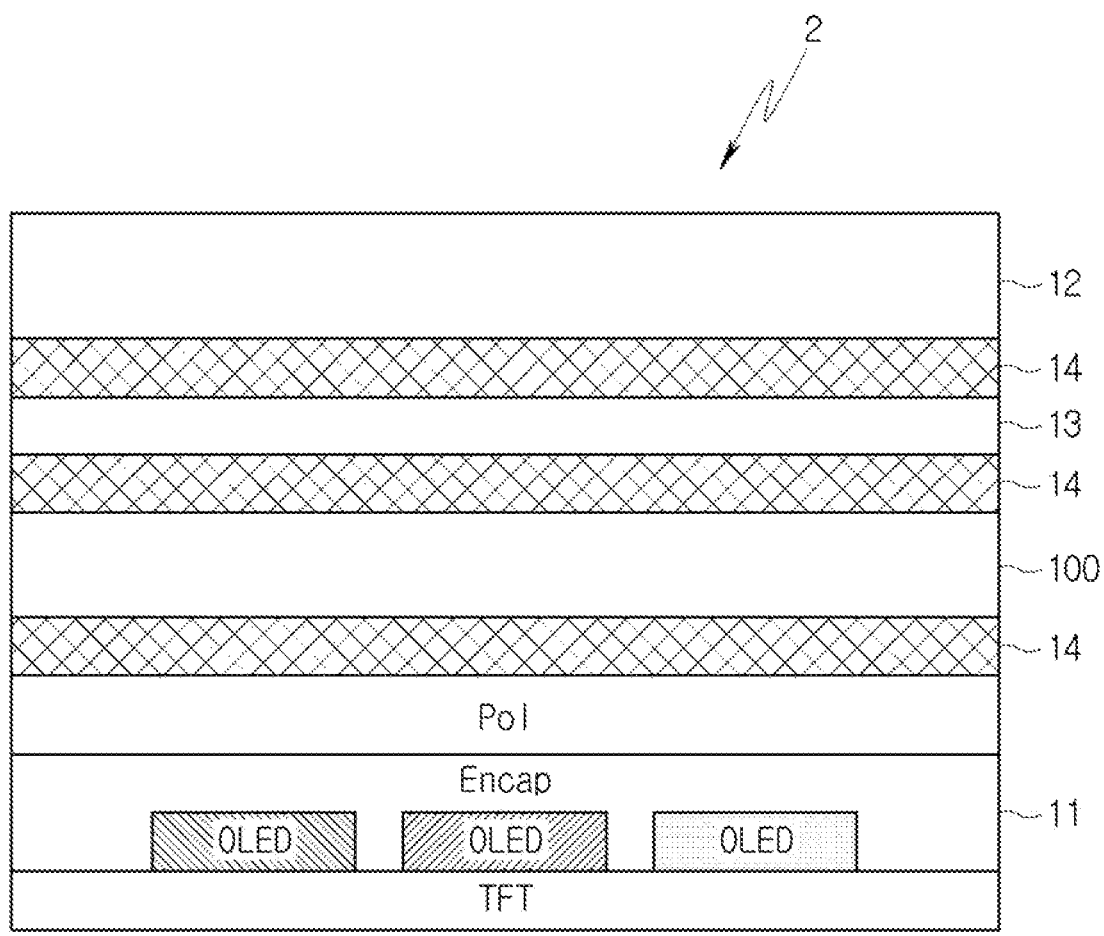
FIG. 14 is a schematic diagram of a display device including a viewing angle adjustment device according to an embodiment of the present disclosure.

FIG. 14 is a schematic diagram of a display device including a viewing angle adjustment device according to an embodiment of the present disclosure.

With reference to FIG. 14, the display device 2 can include the display panel 11, the viewing angle adjustment device 100 and a cover substrate 12.

The display panel 11 can include a plurality of pixels and drivers, to drive the plurality of pixels, disposed in a non-active area near an active area of a base substrate. The pixels can include transistors (TFT) connected to drivers through a control signal line, and light emitting diodes (OLED) connected to the transistors. The transistors adjust an amount of a current applied to the light emitting diodes depending on turning on or off by a control signal applied through a control signal line. The light emitting diodes can emit light at a luminance corresponding to an amount of a current applied through transistors. The display panel 11 can further include an encapsulating layer (Encap) that encapsulates the light emitting diodes (OLED) and an upper protective substrate (Pol).

The viewing angle adjustment device 100 can be disposed on the display panel 11. In the embodiment, the viewing angle adjustment device 100 can be a viewing angle adjustment device according to one embodiment among embodiments explained with reference to FIGS. 1 to 13.

The viewing angle adjustment device 100 can adjust, according to a drive mode of the display device 2, a viewing angle of the display panel 11 by controlling light traveling path generated in the display panel 11. For example, when the display device 2 is driven in the share mode, the light conversion layer 300 of the viewing angle adjustment device 100 is controlled in a light transmissive mode, thereby a view to a front and sides of the display device 2 can be opened up.

Or, when the display device 2 is driven in the private mode, the light conversion layer 300 of the viewing angle adjustment device 100 is controlled in the light blocking mode, thereby a view to a front of the display device 2 is opened up and a view to sides thereof is blocked. In this instance, the viewing angle adjustment device 100 can limitingly open up a viewing angle to one side surface in the edge area through the auxiliary light conversion layer 400. Here, one side surface is an inner side surface of the viewing angle adjustment device 100, specifically, can be a front center direction of the display device 2.

The cover substrate 12 can be disposed on the viewing angle adjustment device 100. The cover substrate 12 can be provided to protect the display device 2 from an external shock or a foreign substance. The cover substrate 12 can be a light transmitting substrate and can be a rigid substrate that includes glass or tempered glass, or a flexible substrate made of plastic.

In the embodiment, the display device 2 can further include a touch panel 13. The touch panel 13 is configured to be a capacitive type or a resistive film type and the like, and can sense a touch input of a user.

The display panel 11, the viewing angle adjustment device 100, the touch panel 13, and the cover substrate 12 can be adhered to each other through an adhesive layer 14. The adhesive layer 14 can be an optical clear adhesive (OCA) or an optical clear resin (OCR).

Described above are embodiments of the present disclosure with reference to the accompanying drawings. It would be understood that the technical configurations of the present disclosure described herein can be implemented in other concrete forms by those skilled in the art without departing from the technical concept or essential features thereof. Thus, it should be understood that embodiments described hereinabove are examples in all aspects, and do not limit the present disclosure. Moreover, the scope of the present invention will be denoted by the claims that are provided hereinbelow, rather than the detailed description. In addition, it should be construed that all modifications or variations that are derived from the meaning, scope and the concept of equivalence of the claims are covered in the scope of the present disclosure.

What is claimed is:

1. A viewing angle adjustment device comprising:
a first protective layer;
a second protective layer disposed on the first protective layer;

a light conversion layer disposed between the first protective layer and the second protective layer and comprising dispersion liquid having dispersed floating particles; and an auxiliary light conversion layer disposed on the second protective layer, wherein the auxiliary light conversion layer comprises:
first patterns where a light absorbing layer and a transparent layer are disposed in a center area, and
second patterns where the light absorption layer, the transparent layer and a reflective layer are disposed in an edge area.

2. The viewing angle adjustment device of claim 1,
wherein the second patterns have a structure where the light absorption layer, the transparent layer and the reflective layer are stacked in order along one direction from an inside to an outside of the viewing angle adjustment device.

3. The viewing angle adjustment device of claim 1,
wherein the edge area is an area where a viewing angle of a user positioning in front of the viewing angle adjustment device is about 30 degrees or more.

4. The viewing angle adjustment device of claim 1,
wherein the reflective layer refracts a portion of light entering to the auxiliary light conversion layer after being emitted from the light conversion layer, and the refracted portion of light in an inward direction of the viewing angle adjustment device.

5. The viewing angle adjustment device of claim 4,
wherein the viewing angle to the inward direction of the viewing angle adjustment device is opened through the reflective layer for the edge area.

6. The viewing angle adjustment device of claim 1,
wherein the light conversion layer has a structure where a partition wall portion and a containing portion with the dispersion liquid injected are alternately disposed, and
wherein heights of the first patterns and the second patterns of the auxiliary light conversion layer are about 1/10 or less of a height of the containing portion.

7. The viewing angle adjustment device of claim 1,
wherein a density of the second patterns in the edge area gradually increases towards an outside of the viewing angle adjustment device.

8. The viewing angle adjustment device of claim 1,
wherein a density of the second patterns in the overall area of the auxiliary light conversion layer has a Gaussian distribution.

9. The viewing angle adjustment device of claim 1,
wherein the auxiliary light conversion layer further comprises reflection patterns protruding from an inner side surface of the reflective layer and having a reverse taper-shaped inner side surface.

10. The viewing angle adjustment device of claim 1,
wherein the auxiliary light conversion layer further comprises light diffusion beads disposed on an inner side surface of the reflective layer.

11. The viewing angle adjustment device of claim 1,
wherein the transparent layer has a sectional form of a reverse prism which is an inverted triangle,
wherein the light absorption layer covers an inner side surface of the transparent layer, and
wherein the reflective layer covers the light absorption layer.

12. The viewing angle adjustment device of claim 1,
wherein the transparent layer is formed by coating a transparent layer surface with a white colored reflective material or a silver-colored highly reflective coating agent, or is composed of an acrylic resin.

13. The viewing angle adjustment device of claim 1,
wherein the reflective layer has a higher refractive index than a refractive index of the light absorption layer and the transparent layer.

14. A display device comprising:
a display panel including pixels and configured to display an image;
a viewing angle adjustment device configured to adjust a viewing angle of the display panel by controlling a path of light emitted by the display panel according to a drive mode; and
a cover substrate disposed on the viewing angle adjustment device,
wherein the viewing angle adjustment device comprises:
a first protective layer;
a second protective layer disposed on the first protective layer;
a light conversion layer disposed between the first protective layer and the second protective layer and comprising dispersion liquid having dispersed floating particles; and
an auxiliary light conversion layer disposed on the second protective layer, and
wherein the auxiliary light conversion layer comprises:
first patterns where a light absorbing layer and a transparent layer are disposed in a center area, and
second patterns where the light absorption layer, the transparent layer and a reflective layer are disposed in an edge area.

15. The display device of claim 14,
wherein the second patterns have a structure where the light absorbing layer, the transparent layer and the reflective layers are stacked in order along one direction from an inside to an outside of the viewing angle adjustment device.

16. The display device of claim 14,
wherein the light conversion layer has a structure where a partition wall portion and a containing portion with the dispersion liquid injected are alternately disposed, and
wherein a height of the first patterns and the second patterns of the auxiliary light conversion layer is about 1/10 or less of a height of the containing portion.

17. The display device of claim 14,
wherein a density of the second patterns in the edge area gradually increases towards an outside of the viewing angle adjustment device.

18. The display device of claim 14,
wherein the auxiliary light conversion layer further comprises reflection patterns protruding from an inner side surface of the reflective layer and having a reverse taper-shaped inner side surface.

19. The display device of claim 14,
wherein the auxiliary light conversion layer further comprises light diffusion beads disposed on an inner side surface of the reflective layer.

20. The display device of claim 14,
wherein the transparent layer has a sectional form of a reverse prism which is an inverted triangle,
wherein the light absorption layer covers an inner side surface of the transparent layer, and
wherein the reflective layer covers the light absorption layer.

21. A viewing angle adjustment device comprising:
a first protective layer;
a second protective layer disposed on the first protective layer;
a first electrode disposed on a upper surface of the first protective layer;
a second electrode disposed on a lower surface of the second protective layer;
a light conversion layer disposed between the first electrode and the second electrode and comprising a partition wall portion and a containing portion alternately disposed, the containing portion including dispersion liquid and floating particles dispersed inside the dispersion liquid; and
an auxiliary light conversion layer disposed on the second protective layer,
wherein the auxiliary light conversion layer comprises:
    first patterns where a light absorbing layer and a transparent layer are disposed in a center area, and
    second patterns where the light absorption layer, the transparent layer and a reflective layer are disposed in an edge area.

22. The viewing angle adjustment device of claim 21,
wherein the second patterns have a structure where the light absorption layer, the transparent layer and the reflective layer are stacked in order along one direction from an inside to an outside of the viewing angle adjustment device.

23. A display device comprising:
a display panel including pixels and configured to display an image;
a viewing angle adjustment device configured to adjust a viewing angle of the display panel by controlling a path of light emitted by the display panel according to a drive mode; and
a cover substrate disposed on the viewing angle adjustment device,
wherein the viewing angle adjustment device comprises:
a first protective layer;
a second protective layer disposed on the first protective layer;
a first electrode disposed on a upper surface of the first protective layer;
a second electrode disposed on a lower surface of the second protective layer;
a light conversion layer disposed between the first electrode and the second electrode and comprising a partition wall portion and a containing portion alternately disposed, the containing portion including dispersion liquid and floating particles dispersed inside the dispersion liquid; and
an auxiliary light conversion layer disposed on the second protective layer, and
wherein the auxiliary light conversion layer comprises:
    first patterns where a light absorbing layer and a transparent layer are disposed in a center area, and
    second patterns where the light absorption layer, the transparent layer and a reflective layer are disposed in an edge area.

24. The display device of claim 23,
wherein the second patterns have a structure where the light absorbing layer, the transparent layer and the reflective layers are stacked in order along one direction from an inside to an outside of the viewing angle adjustment device.

* * * * *